United States Patent [19]
Zydek et al.

[11] Patent Number: 5,909,348
[45] Date of Patent: Jun. 1, 1999

[54] FAULT CURRENT RECOGNITION CIRCUITRY

[75] Inventors: Michael Zydek, Langgöns; Wolfgang Fey, Niedernhausen; Mario Engelmann, Steinbach; Olaf Zinke, Hofheim, all of Germany

[73] Assignee: ITT Manufacturing Enterprises, Inc., Wilmington, Del.

[21] Appl. No.: 08/952,399

[22] PCT Filed: May 7, 1996

[86] PCT No.: PCT/EP96/01896

§ 371 Date: Mar. 5, 1998

§ 102(e) Date: Mar. 5, 1998

[87] PCT Pub. No.: WO96/38736

PCT Pub. Date: Dec. 5, 1996

[30] Foreign Application Priority Data

Jun. 1, 1995 [DE] Germany .......................... 195 26 435

[51] Int. Cl.⁶ ...................................................... H02H 3/18
[52] U.S. Cl. ................................ 361/79; 361/87; 361/86; 361/191
[58] Field of Search .................................. 361/79, 86, 87, 361/18, 93, 100–101, 191; 323/276; 307/86

[56] References Cited

U.S. PATENT DOCUMENTS 5,638,247  6/1997  Loreck et al. ........................... 361/191

FOREIGN PATENT DOCUMENTS 42 42 177  6/1994  Germany .

*Primary Examiner*—Jeffrey Gaffin
*Assistant Examiner*—Michael J. Sherry
*Attorney, Agent, or Firm*—Rader, Fishman & Grauer PLLC

[57] ABSTRACT

A circuitry for detecting a fault current or leakage current on the supply line of an electronic circuit includes a current source which is rated for a maximum allowed fault current or leakage current. The current source is fed by an auxiliary voltage source. The potential on the supply line which prevails when the supply voltage is disconnected due to the leakage current is determined and assessed by a potential monitor.

2 Claims, 3 Drawing Sheets

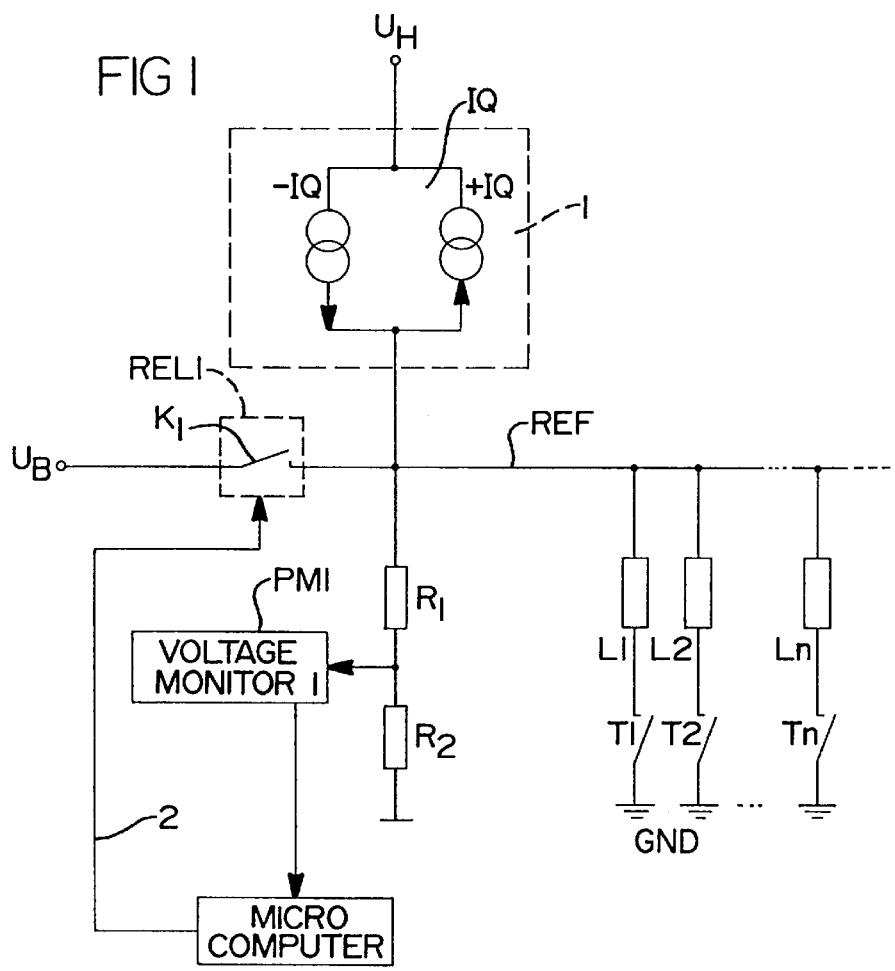
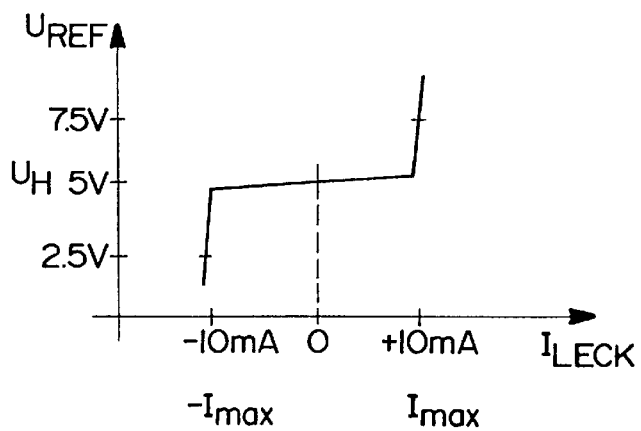
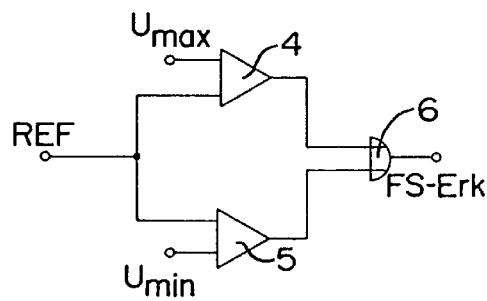

5,909,348

FAULT CURRENT RECOGNITION CIRCUITRY

BACKGROUND OF THE INVENTION

The present invention relates to a circuitry which is used for detecting a fault current on the supply line of an electronic circuit and which is equipped with an auxiliary voltage source and a potential monitor for determining and analyzing the potential prevailing on the supply line during a testing period.

German patent application No. 42 42 177 discloses a circuitry of this type which is used to monitor a large number of valve coils and their associated final stages. For fault current detection, an auxiliary voltage source is connected to the common supply line for the valve coils by way of a high-ohmic resistor, and the potential on the supply line is measured and analyzed. Before this action, the connection of the supply line to the supply source, i.e., the vehicle battery, was interrupted by way of a semiconductor relay. The associated potential monitor is connected by way of a high-ohmic voltage divider. When a shunt circuit or a leakage current from the supply line to the supply source or to ground occurs, the potential on the supply line will vary.

An object of the present invention is to provide a circuitry of this type which has a high degree of accuracy, sensitiveness and reliability in the detection of fault currents, which also includes leakage currents, and, in addition, can be realized with comparatively little effort. A simple and, hence, low-cost measuring apparatus for monitoring the potential on the supply line is deemed sufficient.

SUMMARY OF THE INVENTION

It has been found that this object can be achieved by the design of a circuitry with the special feature that the installation of a current source, which is rated for a maximally allowed current and preferably includes two anti-parallel single current sources, prevents response of the monitoring means as long as the fault current is within the range of predefined limit values, however, that even when the limit values are only slightly exceeded, a very apparent and, therefore, easily assessable potential variation on the supply line is caused during the testing period.

In a preferred aspect of the present invention, two single current sources responding to fault currents in opposite directions are used, whereby it is ensured that fault currents, or shunt circuits, from the supply line to the positive pole of the supply source and to ground are detected.

The circuitry of the present invention is especially appropriate, for example, for monitoring the valve coils and the associated electronic circuits of a controlled brake system, wherein the coils are connected to the supply voltage by way of a common supply line and a common relay. In a brake system of this type, the detection of a fault current must be ensured with a high degree of reliability because the control must be deactivated in a case of malfunction in order to keep the brake system in function. Therefore, the application is critical with respect to safety.

Further features, advantages and possible applications of the present invention can be seen in the following description of an embodiment, making reference to the accompanying drawings.

BRIEF DESCRIPTION OF THE DRAWINGS

In the drawings,

FIG. 1 is a schematically simplified view of the generally electrical components of a circuitry of the present invention.

FIG. 3 is a diagram in which the signal variation is plotted as a function of the fault current in a circuitry of FIG. 1 or FIG. 2.

FIG. 4 is the basic circuit of a potential monitor for the circuitries of FIG. 1 or FIG. 2.

DETAILED DESCRIPTION OF THE DRAWINGS

FIG. 1 is used to illustrate the basic operation of the circuitry of the present invention. L1, L2, Ln designate valve coils comprised in the hydraulic valves of an automotive vehicle control system, for example, an anti-lock brake system (ABS), used for braking pressure modulation. The coils are activated and deactivated by switches or final stages T1, T2, Tn. For energy supply, a joint supply line REF is connected by a relay Rel1 with a working contact $K_1$ to a supply source, i.e., to a vehicle battery having the voltage $U_3$. Contact $K_1$ is made and anti-lock control is operating only in the absence of faults.

A monitoring circuit 1 is provided to detect a fault current. Only a current source IQ including two single current sources −IQ, +IQ is shown in FIG. 1. The monitoring circuit 1 is connected to an auxiliary voltage source $U_H$. Because the potential of the auxiliary voltage source $U_H$ is lower than the potential of the battery voltage $U_B$ and higher than the joint ground potential GND, fault currents in opposite directions are possible in a shunt circuit from the supply line REF to the ground potential GND, on the one hand, and in a shunt circuit from the supply line REF to the battery voltage $U_B$. Therefore, the current source IQ in the embodiment shown has two anti-parallel connected single current sources −IQ and +IQ. When Rel1 or $K_1$ is open, and with open switches T1, T2, Tn, current flow is caused by way of the signal current source −IQ in the event of a shunt circuit from the supply line REF to ground GND and by way of the single current source +IQ in the event of a shunt circuit to the supply voltage $+U_B$. The potential on the supply line REF is (almost) maintained on the potential $U_H$ (as will be explained in the following with reference to FIG. 3), but only as long as the amount of the fault current is inferior to a predetermined limit value, or only as long as the fault current ranges between predetermined limit values $\pm I_{max}$. "$I_{max}$" and "$-I_{max}$" are the "nominal currents" of the current sources "+IQ" or "−IQ".

When the amount of the fault current rises in excess of these limit values $\pm I_{max}$, this will cause a steep variation of the potential on the supply line REF. This potential variation is signaled to the input of a potential monitor PM1 by way of a voltage divider $R_1$, $R_2$. The potential variation is analyzed by way of the potential monitor PM1 and a microcomputer MC which performs still further testing and monitoring operations (not described). As soon as a fault is detected, the relay Rel1 is caused to open by way of a signal line 2, or closing of contact $K_1$ of the relay is prevented. This way, the valves which include coils L1, L2, Ln are prevented from responding. This deactivates the control.

Figure 2:
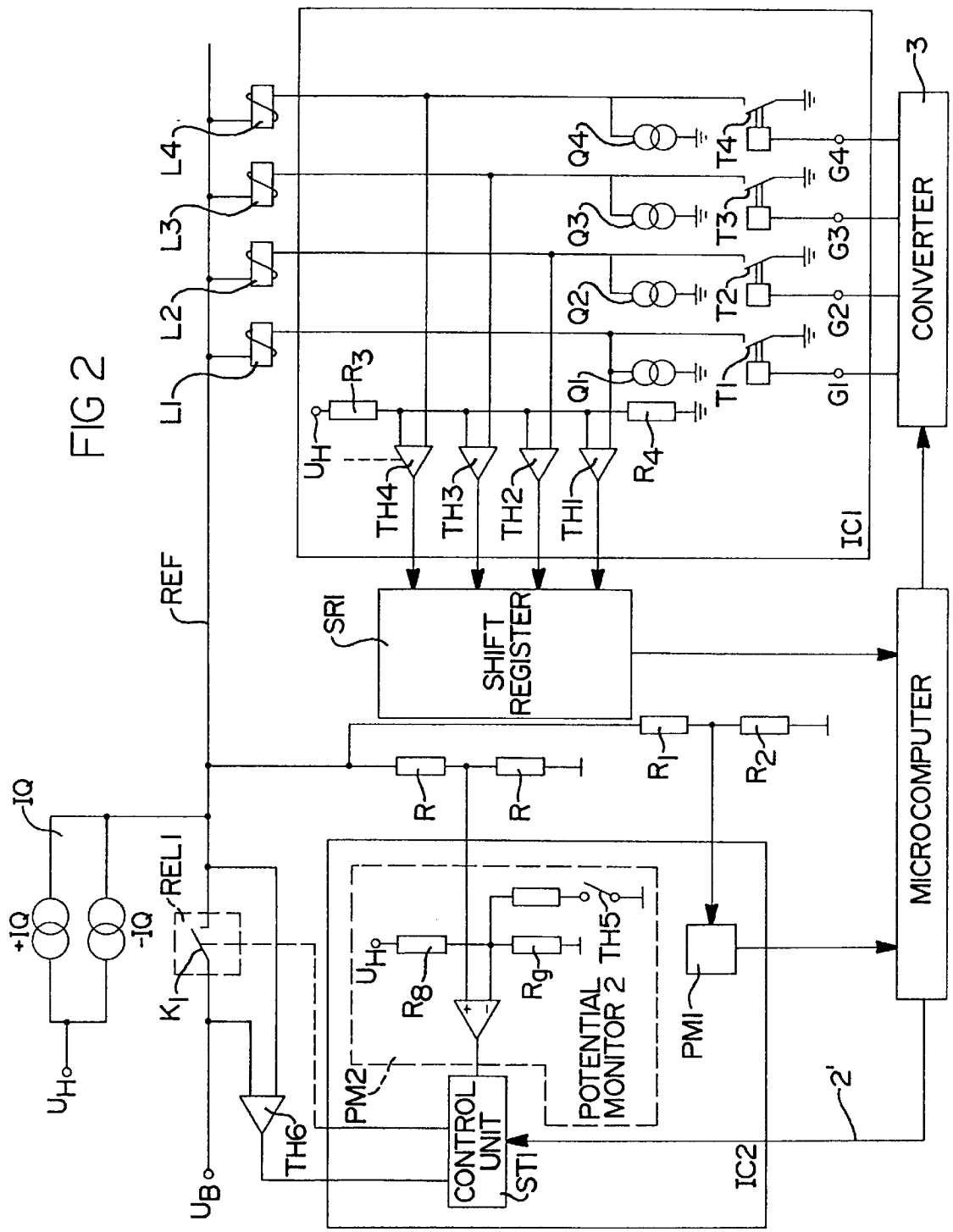
FIG. 2 is a wiring diagram of a monitoring circuit on the basis of the circuitry of FIG. 1.

FIG. 1 and FIG. 2 show the same circuitry. FIG. 1 illustrates only those components which are important for the present invention, whereas FIG. 2 shows further details.

Final stages for activation and deactivation of the exciter current for the valve coils L1 to L4 are represented in FIG.

2 by switches T1 to T4 which are actuated by terminals G1 to G4. It is determined by comparators TH1 to TH4 whether the potential at the output of the switches or transistors T1 to T4 is above or below a predetermined limit value which is defined by way of the auxiliary voltage source $U_H$ and a voltage divider $R_3$, $R_4$. When switch T1 to T4 is opened, the potential is determined in the illustrated embodiments by current sources Q1 to Q4 at the corresponding input of comparators TH1 to TH4.

The output levels of the comparators TH1 to TH4 are registered by a shift register SR1 and conducted serially to the microcomputer MC. Accordingly, test pulses are sent from the microcomputer MC via a converter 3 to the control terminals G1 to G4 of the switches or transistors T1 to T4. As has already been explained by way of FIG. 1, the valve coils L1 to L4 are connected to the voltage $U_B$ of the vehicle battery by way of relay Rell.

The potential on the supply line REF is determined and monitored by means of two potential monitors PM1 and PM2 which are connected to the supply line REF by way of voltage dividers. The function of the potential monitor PM1 has already been described with reference to the embodiment of FIG. 1. The second potential monitor PM2 is a window comparator having a commutable threshold. A switch TH5 switches the threshold over. The output signal of the comparator PM2 is converted in a control unit ST1 to a signal for actuating the semiconductor relay Rell. An output of the microcomputer MC extends to the control unit ST1 by way of a line 2'. When a defect is detected, more particularly, a fault current, Rell is deactivated by way of the control unit ST1, and current supply of the valve coils L1 to L4 or L1 to Ln is thereby interrupted.

Another comparator TH6 is used to determine the switching condition of the relay Rell. The operation of the circuitry of FIG. 2 is as follows:

Relay Rell is the main relay. When the ignition is actuated, initially, contact $K_1$ of Rell is made. The potential variation on the supply line REF caused thereby is monitored by the potential monitor PM2. As long as there is no shunt, and contact $K_1$ is open, the potential on the supply line REF is determined by the auxiliary voltage source $U_H$. After $K_1$ is closed, the battery voltage $U_B$ will prevail on the supply line REF in relation to ground. The amount of $U_B$ is substantially higher than $U_H$.

After contact $K_1$ is closed, the voltage on the input of monitor PM2 will rise in excess of the threshold voltage on the second input of the illustrated comparator of the monitor PM2. The threshold voltage is predefined by the voltage $U_H$ and the resistors $R_8$, $R_9$. The output of the comparator switches to "high". Subsequently, the threshold of the comparator is set to a higher value by way of switch TH5 so that the output of the comparator becomes "low" again. The function of the monitor PM2, with proper operation of relay Rell, is simultaneously tested by these low-high-low transitions. After the switch-over to the higher threshold, the comparator of monitor PM2, by way of the control unit ST1, is used to activate and, if necessary, deactivate the relay Rell when excessive voltages occur on the supply source $U_B$. The activation of the valve coils L1 to L4 is tested by way of short test pulses. The respective switch T1 to T4 is closed by these test pulses, and the potential variation caused thereby on the input of the corresponding comparator TH1 to TH4 is assessed in the fashion described hereinabove. The contact $K_1$ of relay Rell is open during these test pulses.

Monitoring the supply line REF with respect to shunts to the supply voltage source $+U_B$ or to ground is performed in the fashion described hereinabove by means of the current source IQ or the single current sources +IQ and −IQ.

The embodiment of FIG. 3 shows the potential variation on the supply line REF as a function of the shunts or the corresponding fault currents $I_{FS}$. The voltage of the auxiliary voltage source $U_H$ amounts to 5V in the present case. The current source IQ is rated ±10 mA in this embodiment. As long as the fault current is within the limits ±10 mA, the potential on the supply line REF is maintained on the potential $U_H$=5V by the voltage source IQ. However, as soon as the current exceeds the value of ±10 mA (even if this exceeding is only insignificant), the potential will change almost abruptly in the direction of ground potential or in the direction of the battery voltage $U_B$. A very simple potential monitor PM1 is sufficient to determine and assess this potential variation. The respective tolerances, for example, of the voltage divider resistors R1, R2, the actual amount of the battery voltage $U_B$, etc., are not important for the accuracy and reliability of the fault current detection.

A simple example of a potential monitor of this type is shown in FIG. 4. The potential on the supply line REF is compared with predetermined threshold values $U_{max}$ and $U_{min}$ by way of two comparators 4, 5. A fault current identification signal is issued by an OR gate 6 when the threshold values are reached.

Figure 5:
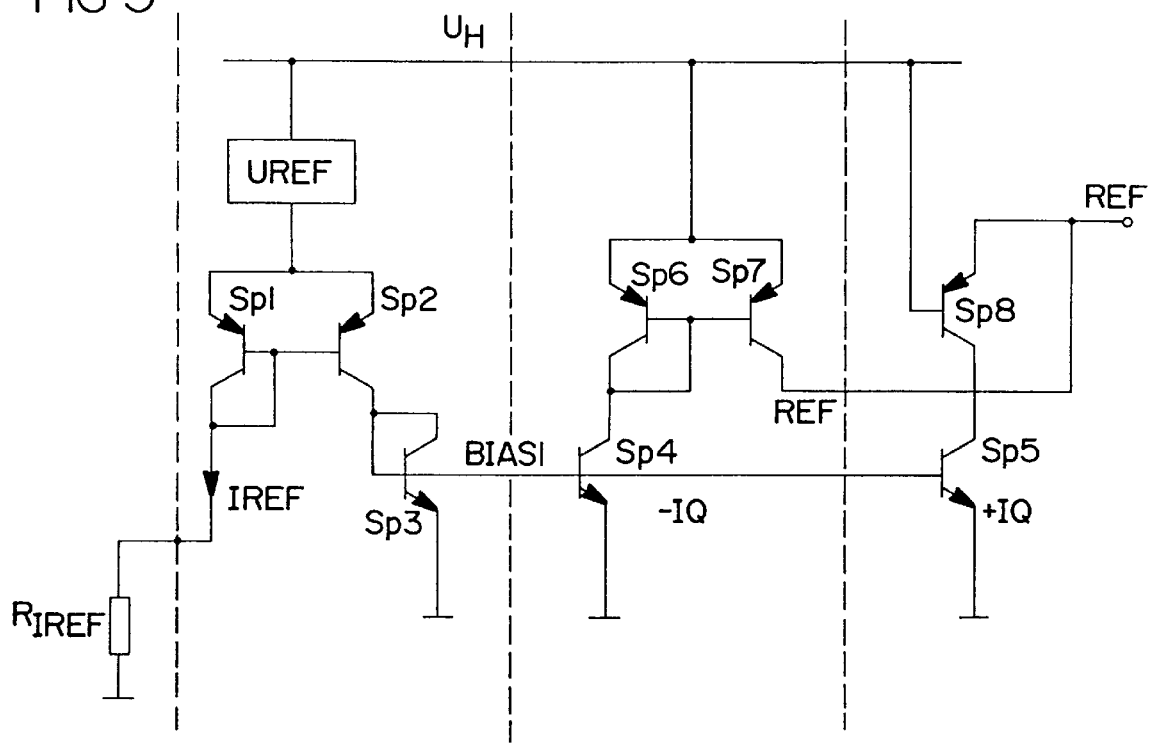
FIG. 5 is a diagrammatic view of a part of an integrated circuit for realizing current sources for the circuitry of FIG. 1 or FIG. 2.

FIG. 5 shows an example where the current source IQ is realized by means of an integrated circuit which includes current mirror circuitries.

A defined reference current "IREF" is adjusted in a known manner by way of an external resistor "$R_{IREF}$" and an internal reference voltage "IREF". This circuit is connected to the external auxiliary voltage source $U_B$. A reference quantity BIAS1 is produced in a known fashion by way of a current mirror circuit with the transistors Sp1, Sp2, Sp3. BIAS1 is applied to the basis of the transistors Sp4, Sp5 and determines the operating point of the transistors. A single current source −IQ is provided by a current-mirroring operation by means of the transistors Sp6, Sp7 which are connected to the collector of the transistor Sp4 and represent a current mirror circuit. The single current source +IQ is provided by way of the serially connected transistors Sp5, Sp8. A current source IQ is thereby provided which is composed of two anti-parallel connected current sources and can furnish a current of a predefined magnitude to a higher potential (+$U_B$) or to a lower potential (GND). The nominal value of these current sources, i.e. the maximum value (+$I_{max}$, −$I_{max}$) for which the current sources are rated, may be equal in both directions (as in the present embodiment), or different maximum values may be predefined.

Integrated circuits of this type are known in the art. The relatively great difference in voltage upon exceeding the predetermined current limit values +$I_{max}$ or −$I_{max}$ reduces the demands placed on the potential monitor and makes the monitoring system less sensitive to stray fields (electromagnetic compatibility). The total structure needed for the circuitry of the present invention is thus comparatively small.

Figure 6:
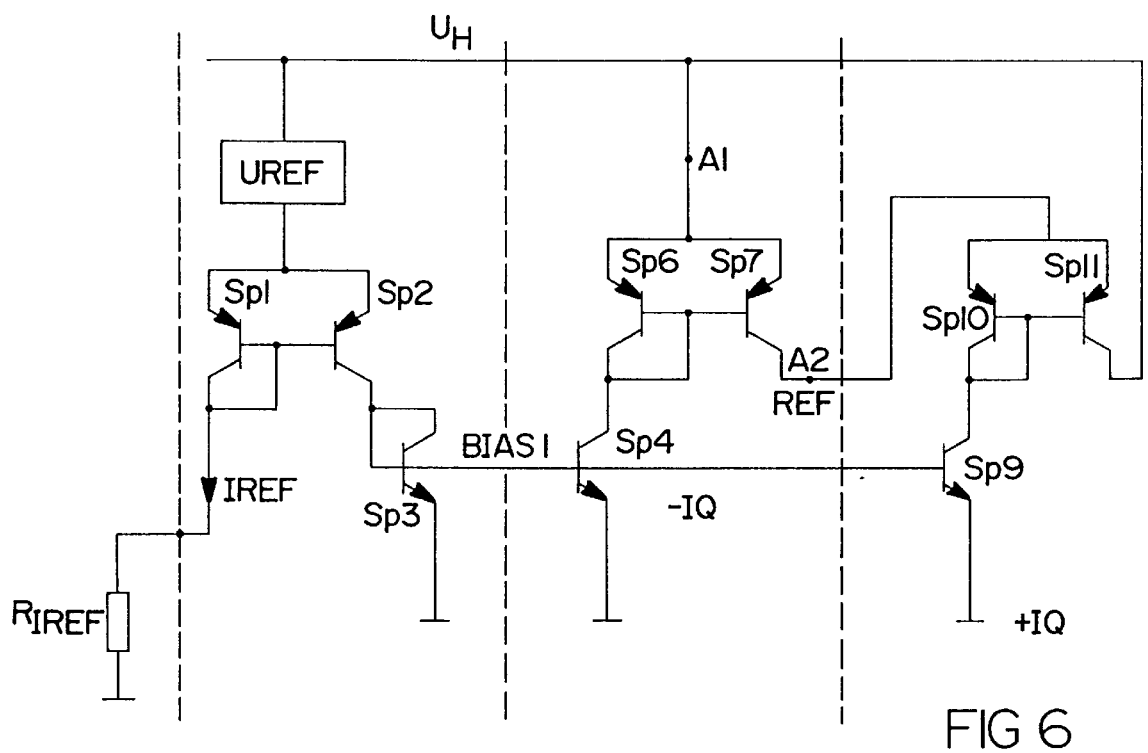
FIG. 6 is a variation of the circuit in FIG. 5 in the same illustration as in FIG. 5.

The embodiment of FIG. 6 shows a circuit design variation which differs from the circuit of FIG. 5 only by the slightly different connection of the transistors Sp9, Sp10, Sp11 which form the right-hand current source +IQ. This circuit variation shows that the voltage sources −IQ and +IQ differs only by exchange of the connections A1, A2 leading to the auxiliary voltage source $U_H$ and the REF connection. The current sources −IQ and +IQ are identical in terms of their circuits, however, the directions of current flow are contrary, due to exchanged connections A1, A2.

We claim:

1. A circuitry for detecting a fault current on a supply line of an electronic circuit, including an auxiliary voltage source and a potential monitor for determining and analyzing the potential prevailing on the supply line during a testing period, wherein the supply line is connected to the auxiliary voltage source by way of a current source which is rated for a maximum allowed fault current, wherein the potential of the auxiliary voltage source ranges between the potential of a supply voltage and a ground potential, and wherein the current source includes two anti-parallel connected single current sources which are each rated for the maximum allowed fault current of one direction.

2. A circuitry as claimed in claim 1, further including circuitry means for monitoring valve coils and associated electronic circuits of a controlled brake system, wherein the coils are connected to the supply voltage by way of a common supply line and a common relay.

* * * * *